US006335140B1

(12) United States Patent
Miyazaki

(10) Patent No.: US 6,335,140 B1
(45) Date of Patent: Jan. 1, 2002

(54) THERMAL TRANSFER MATERIAL AND PRINTING METHOD USED WITH THE SAME

(75) Inventor: Takao Miyazaki, Saitama (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/588,343

(22) Filed: Jun. 7, 2000

(30) Foreign Application Priority Data

Jun. 8, 1999 (JP) .............................................. 11-160516
Jul. 30, 1999 (JP) .............................................. 11-217724

(51) Int. Cl.[7] .......................... G03F 7/34; G03C 11/12; G03C 7/00; B41M 5/24; B41J 2/01

(52) U.S. Cl. ........................ 430/138; 430/200; 430/256; 430/257; 430/259; 430/262; 430/263; 430/964; 430/348; 347/103; 347/106; 347/175; 347/212; 503/201; 503/208; 503/227

(58) Field of Search .................................. 430/138, 256, 430/259, 200, 257, 262, 263, 964, 348; 503/227, 201, 208; 347/103, 106, 212, 175

(56) References Cited

U.S. PATENT DOCUMENTS 4,751,165 A * 6/1988 Rourke et al. ............... 430/138
5,019,475 A * 5/1991 Higashiyama et al. ...... 430/138
5,271,990 A * 12/1993 Kronzer et al. .............. 428/211
5,501,902 A * 3/1996 Kronzer ......................... 428/323
5,612,168 A * 3/1997 Ishikawa ........................ 430/138
5,948,586 A * 9/1999 Hare ............................. 430/138
6,033,824 A * 3/2000 Hare ............................. 430/138

FOREIGN PATENT DOCUMENTS

JP 05000575 A 1/1993 ............. B41M/5/26
WO WO 98/21398 * 5/1998 ................... 430/138

* cited by examiner

*Primary Examiner*—Richard L. Schilling
(74) *Attorney, Agent, or Firm*—Sughrue Mion, PLLC

(57) ABSTRACT

A thermal transfer material includes a support. A release layer is overlaid on the support. A coloring transfer layer is overlaid on the release layer, has thermoplasticity, and is colorable by being exposed and then pressurized. In a printer for use with the thermal transfer material, an image is formed by exposing the coloring transfer layer. The coloring transfer layer is placed on image receiving material after the image is formed. The thermal transfer material is heated and pressurized while the coloring transfer layer is placed on, so as to color the image and transfer the coloring transfer layer to the image receiving material.

9 Claims, 11 Drawing Sheets

50
52
51
53
55
58
59
50a
75
56
61
62
50b
57
63
64
50c

THERMAL TRANSFER MATERIAL AND PRINTING METHOD USED WITH THE SAME

BACKGROUND OF THE INVENTION

1. Field of the Invention

The present invention relates to thermal transfer material, and a printing method and printer used with the same. More particularly, the present invention relates to thermal transfer material suitable for printing to an image receiving material of which a printing surface is not very smooth, and a printing method and printer used with the same.

2. Description Related to the Prior Art

Material with a not smooth surface, such as paper or fabric, has a characteristic that it is difficult for the surface to receive ink stably. It happens that dots are missing or out of order. Images are very hard to be recorded with high quality. There is a known system in which the image is created once on an intermediate material, and then is transferred to an image receiving material. JP-A 05-000575 discloses transfer material, which includes a support with releasability, and a layer of developer agent overlaid on the support.

In the printer according to this prior document, photosensitive pressure-sensitive material of a continuous sheet, while fed, is exposed by light reflected by an original. In the photosensitive pressure-sensitive material, a photosensitive pressure-sensitive layer includes a great number of micro capsules distributed uniformly. Each of the micro capsules contains dye precursor, photo-setting resin and photo polymerization initiator. The photo-setting resin is hardened in response to application of exposure light. A certain number of micro capsules in the photosensitive pressure-sensitive material are hardened, the certain number being proportional to an amount of the exposure light. Then the photosensitive pressure-sensitive material is placed on the transfer material, and passed together between press rollers. Then the remainder of the micro capsules without being hardened even after the exposure are destroyed. The dye precursor flows from the micro capsules, and reacts upon the developer agent in a developer layer, so that a full-color image is created in the developer layer of the transfer material.

The image of the original is read by a scanner. A computer is operated to detect a colored portion in the image. Then a thermal printer is used to produce a printing plate of a screen sheet according to the colored portion of the image as detected by the computer, the screen sheet consisting of mesh sheet of nylon or the like and thermosensitive resin overlaid on the mesh sheet. To be precise, the thermosensitive resin is melted in positions corresponding to the colored portion of the image of the original. Only portions of the mesh sheet remain those positions.

After this, the screen sheet is placed on the transfer material by positioning the image in the transfer material suitably. Then polyolefin resin dispersion liquid is pressed and applied as a thermoplastic resin coating to the transfer material. When the screen sheet is separated and dried. The thermoplastic resin is kept with the transfer material to cover the image.

The thermoplastic resin of the transfer material is placed on an image receiving sheet material of polyethylene terephthalate film, and is passed together between hot press rollers, to be attached thereto. Then the transfer material is fused to the image receiving material by means of the thermoplastic resin. After cooling down to the room temperature, the support in the transfer material is peeled. The portion of the transfer material with the image is transferred to the image receiving material.

The above-mentioned printer only forms the image in the developer layer of the transfer material. For transferring the developer layer to the image receiving material with the image, the additional steps are required, the steps including the step of providing the image of the transfer material with the thermoplastic resin, the step of fusing the transfer material to the image receiving material by means of the thermoplastic resin, and the step of peeling the support of the transfer material. Thus, the printer has a shortcoming in the complexity in the printing process and necessity of much time for printing.

SUMMARY OF THE INVENTION

In view of the foregoing problems, an object of the present invention is to provide thermal transfer material and a printing method and printer usable with the same, with which easy and rapid printing is possible with an image receiving material of which a printing surface is not very smooth.

In order to achieve the above and other objects and advantages of this invention, a thermal transfer material comprises a support. A release layer is overlaid on the support. A transfer layer is overlaid on the release layer, as thermoplasticity, and is adapted to forming an image herein.

The transfer layer includes thermoplastic resin, and laced on image receiving material. The thermoplastic resin is melted by being heated, and transfers the transfer layer to the image receiving material by being pressurized.

At least one of the release layer and the transfer layer is transparent.

In a preferred embodiment, a thermal transfer material comprises a support. A release layer is overlaid on the support. A coloring transfer layer is overlaid on the release layer, has thermoplasticity, and is colorable by being exposed and pressurized.

The coloring transfer layer further includes dye precursor and photo-setting resin, the dye precursor is colorable in a predetermined color, and the photo-setting resin is hardened in response to light of a color complementary to the predetermined color.

The coloring transfer layer includes developer agent and plural micro capsules distributed uniformly. The micro capsules include the dye precursor and the photo-setting resin, and the dye precursor flows out by pressurization, and reacts upon the developer agent to develop color.

The predetermined color comprises at least three colors, the dye precursor comprises at least three types, the photo-setting resin comprises at least three types, and light of at least three complementary colors is applied to the photo-setting resin, for coloring in a full-color manner.

In another preferred embodiment, the support has a continuous shape. The predetermined color comprises at least first, second and third colors. At least first, second and third regions are arranged cyclically in a material longitudinal direction, colorable in the first, second and third colors, and adapted to image recording in sequence for full-color recording.

According to one aspect of the invention, a thermal transfer material comprises a support. A release layer is overlaid on the support. An ink receiving transfer layer is overlaid on the release layer, and has thermoplasticity and ink receptivity.

The ink receiving transfer layer includes porous ink receiving substance.

According to another aspect of the invention, a thermal transfer material comprises a support. A release layer is overlaid on the support. A thermosensitive coloring transfer layer is overlaid on the release layer, is colorable in a predetermined color in response to application of heat, and has thermoplasticity.

The coloring transfer layer includes first coloring substance and plural micro capsules distributed uniformly. The micro capsules include second coloring substance, and the second coloring substance thermally reacts upon the first coloring substance to develop the predetermined color.

Furthermore, a heat resistant layer is overlaid on the support in a surface thereof opposite to the release layer. At least one of the support, the release layer and the heat resistant layer is transparent.

The support has a continuous shape. The predetermined color comprises at least first, second and third colors. At least first, second and third regions are arranged cyclically in a material longitudinal direction, colorable in the first, second and third colors, and adapted to image recording in sequence for full-color recording.

In a further preferred embodiment, the predetermined color comprises at least first, second and third colors. The coloring transfer layer is constituted by a combination of at least first, second and third thermosensitive coloring layers, overlaid on one another in sequence from the release layer, colorable in the first, second and third colors, and adapted to image recording in sequence for full-color recording. The first and second coloring layers are disposed closer to the support, and have optical fixability in response to electromagnetic rays in a predetermined wavelength range. The third coloring layer is disposed farthest from the support, and includes the thermoplastic resin, and the thermoplastic resin is heated to a glass transition point thereof by application of heat for coloring.

According to a further aspect of the invention, a printing method in which thermal transfer material is used is provided. The thermal transfer material comprises a support. A release layer is overlaid on the support. A transfer layer is overlaid on the release layer, and has thermoplasticity. In the printing method, an image is formed in the transfer layer. The transfer layer is placed on image receiving material after the image is formed. The thermal transfer material is heated and pressurized while the transfer layer is placed on, so as to transfer the transfer layer to the image receiving material.

The transfer layer is a coloring transfer layer colorable by being exposed and pressurized. The image forming step includes exposing the coloring transfer layer. The heating and pressurizing step includes coloring the image formed by exposure.

The coloring transfer layer further includes thermoplastic resin, dye precursor and photo-setting resin, the dye precursor is colorable in a predetermined color, and the photo-setting resin is hardened in response to light of a color complementary to the predetermined color. The image forming step includes exposing the thermal transfer material by light of the complementary color according to image data of the predetermined color, for hardening part of the photo-setting resin associated with the image data, to disable part of the dye precursor from developing color. The heating and pressurizing step includes destroying part of the photo-setting resin remaining unhardened, for causing the dye precursor to develop color.

According to another aspect of the invention, a printing method in which thermal transfer material is used is provided. The thermal transfer material comprises a support. A release layer is overlaid on the support. A thermosensitive coloring transfer layer is overlaid on the release layer, is colorable in a predetermined color in response to application of heat, and has thermoplasticity. In the printing method, the coloring transfer layer is placed on image receiving material. The thermal transfer material is heated and pressurized while the coloring transfer layer is placed on, so as to record an image thermally in the coloring transfer layer and transfer the coloring transfer layer to the image receiving material.

The coloring transfer layer comprises first, second and third thermosensitive coloring transfer layers, the first, second and third regions have respectively the first, second and third coloring transfer layers, and the first and second coloring transfer layers have optical fixability in response to electromagnetic rays in a predetermined wavelength range. Furthermore, image recording is effected to the f first and second coloring transfer layers by heating and pressurization. The first and second coloring transfer layers are optically fixed after the image recording. The first and second coloring transfer layers are transferred to image receiving material by heating and pressurization after fixation. The heating and pressurizing step includes image recording and transfer of the third coloring transfer layer.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENT(S) OF THE PRESENT INVENTION

Figure 1A:
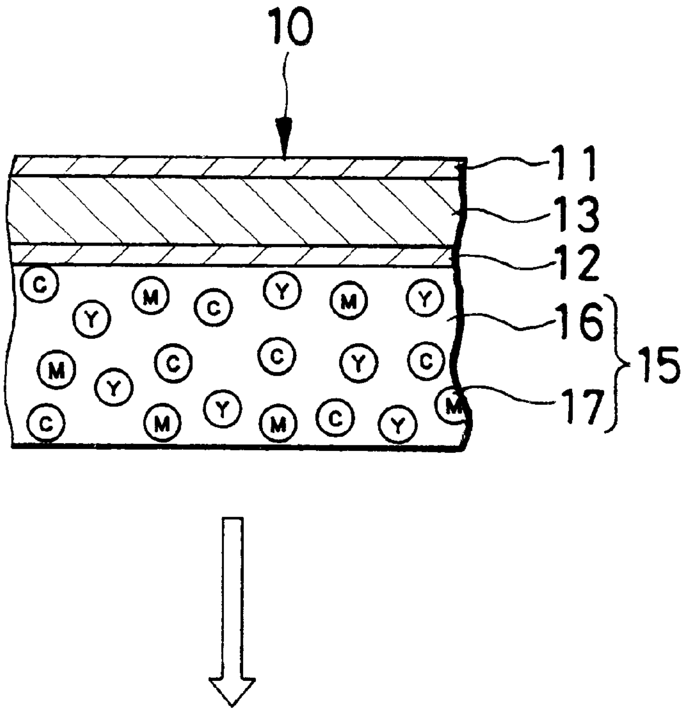
FIG. 1A is an explanatory view in section, illustrating a thermal transfer material.

In FIG. 1A, thermal transfer material 10 is constituted by a support 13, release layer 12, coloring transfer layer 15 and heat resistant layer 11. The release layer 12 is overlaid on one face of the support 13. The coloring transfer layer 15 is overlaid on the release layer 12. The heat resistant layer 11 is overlaid on the remaining face of the support 13. The coloring transfer layer 15 consists of developer agent/thermoplastic resin 16 and a great number of micro capsules 17 distributed uniformly in the developer agent/thermoplastic resin 16. The micro capsules 17 are according to a known system according to CYCOLOR (trade name). The developer agent/thermoplastic resin 16 is a mixture of developer agent and thermoplastic resin.

Each of the micro capsules 17 contains dye precursor, photo-setting resin and photo polymerization initiator. The dye precursor includes three types for developing respectively yellow, magenta and cyan colors when reacted upon the developer agent in the developer agent/thermoplastic resin 16. The photo-setting resin includes three types which are hardened in response to application of respectively red, green and blue light. Combinations of the dye precursor and photo-setting resin are so predetermined that the color of light on which the photo-setting resin reacts is complementary to the color to be developed by the dye precursor. Note that the photo polymerization initiator is a compound for ensuring efficiency in reaction of developing colors even in response to light with small intensity. The micro capsules 17 according to the embodiment include yellow, magenta and cyan coloring micro capsules. Those three types are mixed in the coloring transfer layer 15 at an equal amount.

Figure 1B:
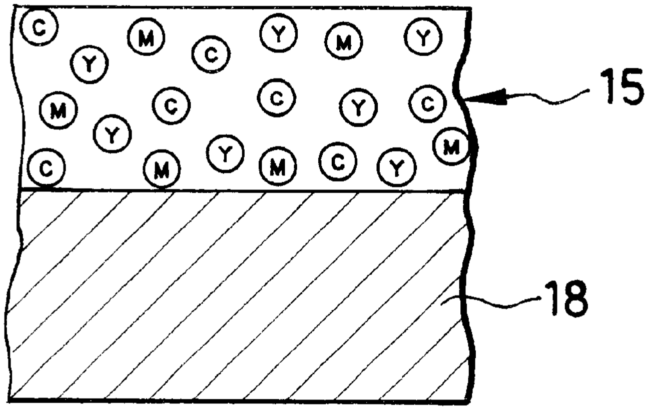
FIG. 1B is an explanatory view in section, illustrating a print obtained by using the thermal transfer material.

A yellow-coloring group of micro capsules included in all the micro capsules 17 include dye precursor for developing yellow color, and also photo-setting resin hardened in response to blue light. As the number of micro capsules to be hardened is proportional to an amount of light applied thereto. According to blue image data, a light amount of blue light is determined. Blue light of this amount is applied to the coloring transfer layer 15. Then the coloring transfer layer 15 is pressurized. So the remainder of the yellow-coloring micro capsules, which remain not hardened, are destroyed. The dye precursor flows out of the destroyed ones of the micro capsules 17, reacts upon developer agent in the developer agent/thermoplastic resin 16, and develops yellow color to record yellow dots. Density of the yellow dots is inversely proportional to the light amount of the blue light. In such a manner, red, green and blue images are recorded to the coloring transfer layer 15 in forms of latent images. The thermal transfer material 10 is pressurized to process a positive image in the coloring transfer layer 15. Note that this positive image is a mirror image of the original image. In FIG. 1B, the coloring transfer layer 15 is transferred to image receiving paper 18 to obtain a print finally.

Examples of plastic films for the support 13 are polyethylene terephthalate film, polyethylene naphthalate film and polyimide film. Also, it is possible not to overlay the release layer 12 on the support 13, and to form the support 13 from substance with good releasability. Examples of substances with comparatively good releasability are glassine paper, coated paper, polyester film, polyethylene film and polypropylene film.

The developer agent in the developer agent/thermoplastic resin 16 is mixed with the thermoplastic resin by means of binder at a proportion not influencing the color development. Examples of the binder are phenol compounds and aromatic carboxylic acid compounds, the phenol compounds including p-phenyl phenol, the aromatic carboxylic acid compounds including compounds of salicylic acid, gallic acid, and propyl tannic acid. Examples of the thermoplastic resin in the developer agent/thermoplastic resin 16 are vinyl resin, acrylic resin, styrene resin, polyamide resin, wax, and the like. Examples of the vinyl resin are ethylene/vinyl acetate copolymer, rosin ester, vinyl alcohol/vinyl acetate copolymer, vinyl alkyl ether/maleic anhydride copolymer, polyvinyl chloride, and vinyl chloride/vinyl acetate copolymer. Examples of the acrylic resin are polyethyl acrylate, polybutyl methacrylate, and polymethyl cyanoacrylate.

Figure 2:
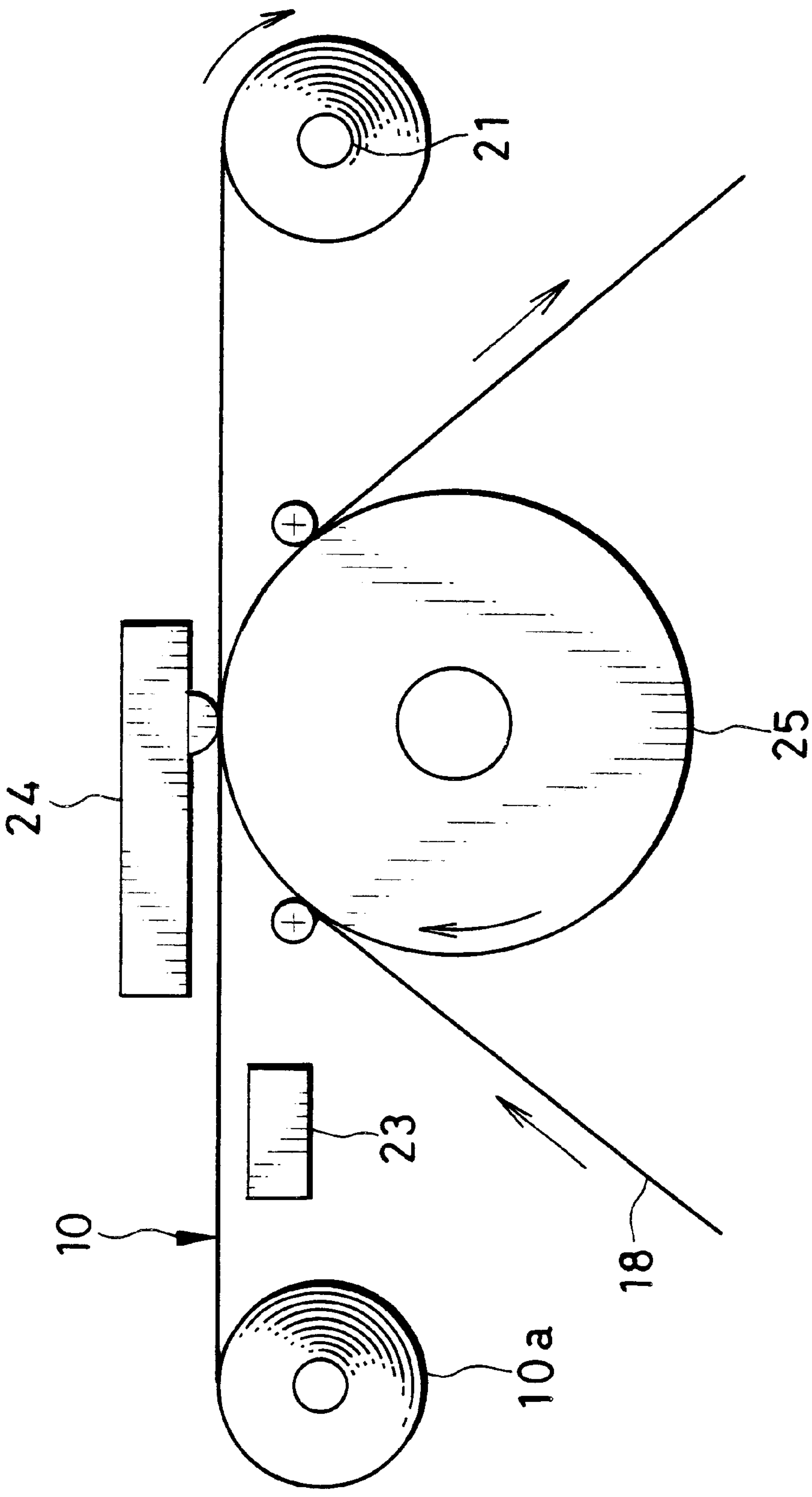
FIG. 2 is a side elevation illustrating a printer for use with the thermal transfer material of FIG. 1A.

In FIG. 2, a material roll 10*a* of the thermal transfer material 10 is used in a printer according to the invention.

In the material roll 10*a*, the thermal transfer material 10 is wound with the coloring transfer layer 15 positioned internally. A feeder shaft 21 feeds the thermal transfer material 10 in a straight manner and winds the thermal transfer material 10 at the same time. Between the material roll 10*a* and feeder shaft 21, an LED exposure head 23 is disposed, and includes plural light-emitting diodes (LEDs) for emitting red, green and blue light according to image data. A thermal head 24 and platen roller 25 are arranged downstream from the LED exposure head 23, and opposed to each other with respect to a feed path of the thermal transfer material 10.

The LED exposure head 23 has a shape longer in the main scan direction, which is perpendicular to the surface of the drawing sheet. The LED exposure head 23 includes three LED arrays, extended in the main scan direction, for emitting respectively red, green and blue light. Each LED array includes plural light-emitting diodes (LEDs) arranged in a straight manner, and has a length substantially equal to a width of the thermal transfer material 10. The LED arrays are arranged in the sub scan direction. There are lenses and/or other optical elements associated with the LEDs, for causing red, green and blue light from the LED arrays to illuminate the same position in the surface of the coloring transfer layer 15. Note that SELFOC lens arrays or distributed index lens arrays may be disposed in front of respectively the LED arrays, for recording of three lines to the coloring transfer layer 15.

The thermal head 24 consists of a great number of heating elements arranged in a linear manner in a main scanning direction. When the thermal transfer material 10 is fed after being exposed by the LED exposure head 23, the thermal head 24 presses the thermal transfer material 10 against the platen roller 25. The heating elements are driven to apply heat to the thermal transfer material 10. In the platen roller 25, the image receiving paper 18 is mounted on a portion approximately one fourth as large as its peripheral surface. The platen roller 25 rotates in synchronism with feeding of the thermal transfer material 10, and supports the thermal transfer material 10 in a position to squeeze the same between it and the thermal head 24.

Figure 3:
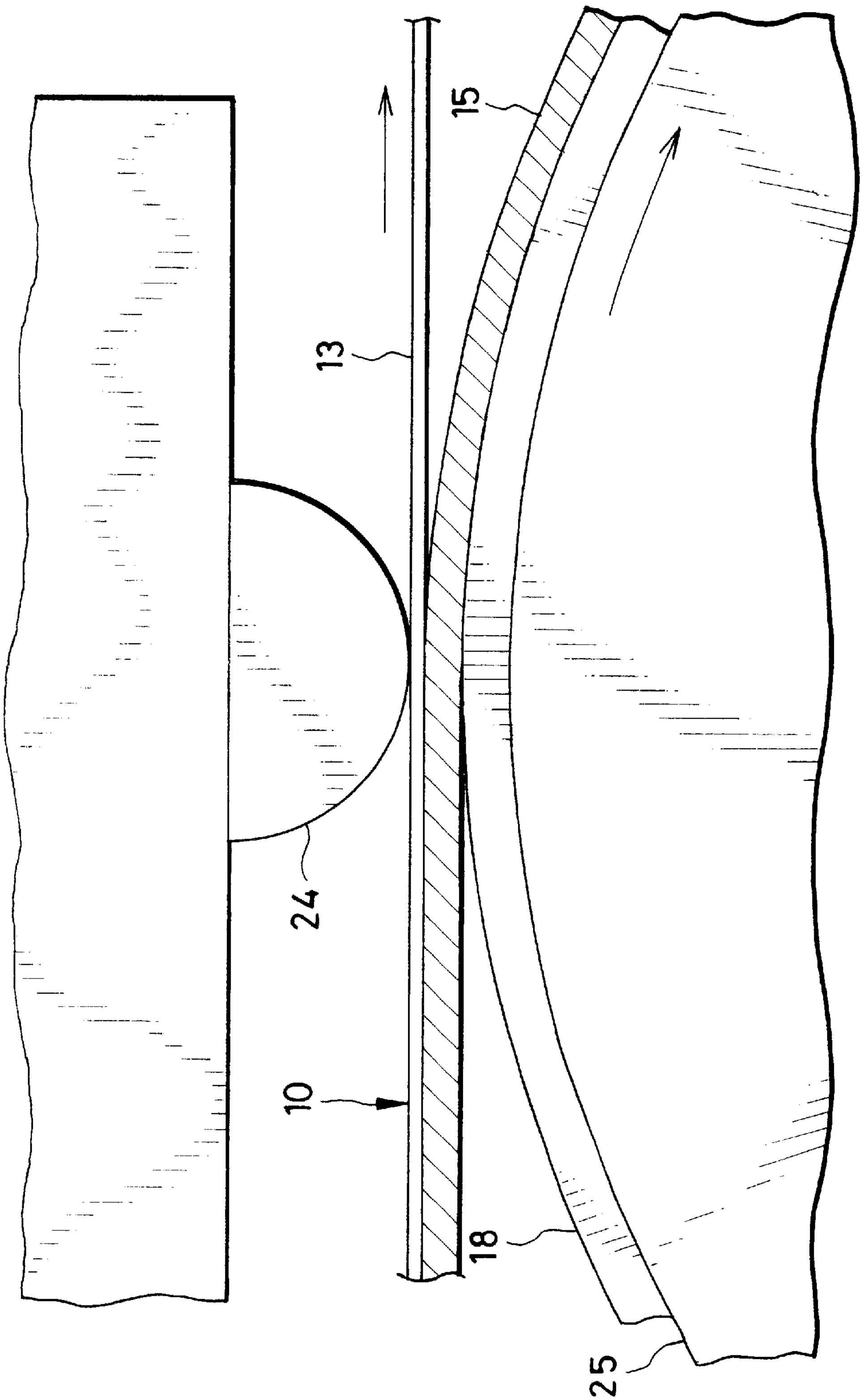
FIG. 3 is a side elevation in enlargement, illustrating a thermal head, a platen and the thermal transfer material.

In FIG. 3, the thermal transfer material 10 after being exposed becomes squeezed between the thermal head 24 and platen roller 25. The coloring transfer layer 15 is heated at the same time as the thermal transfer material 10 is pressed against the image receiving paper 18. The color is developed by destruction of the micro capsules 17. At the same time, the developer agent/thermoplastic resin 16 is melted. The coloring transfer layer 15 with the image is peeled at the release layer 12, and transferred to the image receiving paper 18.

In operation, the printer is used to print an image photographed by a digital camera. At first, a memory card or smart media (trade name) to which image data is written by the digital camera is taken away from the digital camera, and is set in the printer. Frame designating keys are operated in the printer to select a desired one of frames. Then a printing key is operated. Gradation image data of the designated frame is written to an image memory in a color separated manner of the red, green and blue colors.

Then red image data of one line is read from the image memory and sent to a head driver for the LED exposure head 23. The LED exposure head 23 is caused to apply red light to the coloring transfer layer 15 of the thermal transfer material 10. At the same time, the LED exposure head 23 applies green light to the coloring transfer layer 15 according to green image data of one line, and applies blue light to the coloring transfer layer 15 according to blue image data of one line. Thus, line light of the three colors is applied to the coloring transfer layer 15 in the same line position.

After the thermal transfer material 10 is fed by one line, image data of one second line is read. In a manner similar to the above, light of the red, green and blue colors is applied to the coloring transfer layer 15 of the thermal transfer material 10. The coloring transfer layer 15 in the thermal transfer material 10 is similarly exposed line after line, until the entirety of the designated frame is exposed finally. Part of the micro capsules 17 for coloring of yellow, magenta and cyan are hardened according to light amounts of the blue, green and red colors.

When the thermal transfer material 10 comes to a position between the thermal head 24 and platen roller 25, the thermal head 24 is shifted toward the platen roller 25, and applies heat and pressure to the coloring transfer layer 15 of the thermal transfer material 10 in contact with the image receiving paper 18 on the platen roller 25. The remainder of the micro capsules 17 that have not been hardened by the exposure are destroyed. The dye precursor is caused to flow out to react upon the developer agent. Yellow, magenta and cyan images are colored and recorded at density that is inversely proportional to blue, green and red light amounts. At the same time, heat is applied to the coloring transfer layer 15 through the heat resistant layer 11, support 13 and release layer 12 to melt the coloring transfer layer 15, which is peeled at the release layer 12 and transferred to the image receiving paper 18. Finally, a full-color image is created on the image receiving paper 18.

It is to be noted that the construction of the present embodiment may be used also in a printer which includes a protecting light source and optical system instead of the LED exposure head 23, and in which an original frame of photo film is optically projected to the thermal transfer material 10 in a manner of a photographic printer. Such a photo film can be a reversal photo film, and should be oriented to create a mirror image on the thermal transfer material 10 with reference to the original frame.

Figure 4:
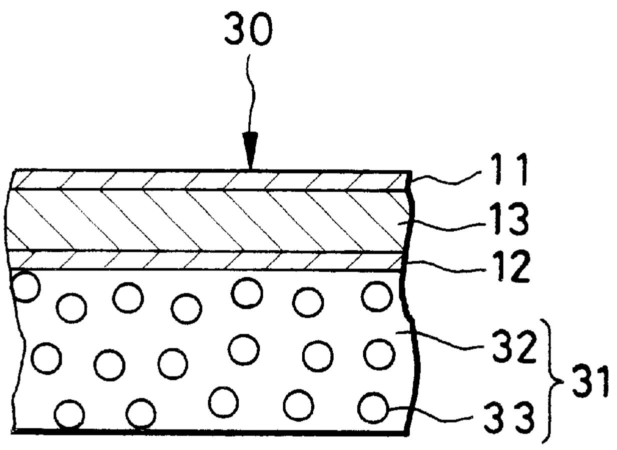
FIG. 4 is an explanatory view in section, illustrating another preferred thermal transfer material.

Another preferred embodiment is described now, in which an ink jet recording head is used instead of the LED exposure head 23. In FIG. 4, thermal transfer material 30 has an ink receiving transfer layer 31, which consists of ink receiving substance 32 and thermoplastic resin grains 33. The ink receiving substance 32 is porous to have ink receptivity. Examples of the ink receiving substance 32 are synthetic noncrystalline silica, ZnO powder, and mixture of aqueous adhesive agent and cation resin.

Figure 5:
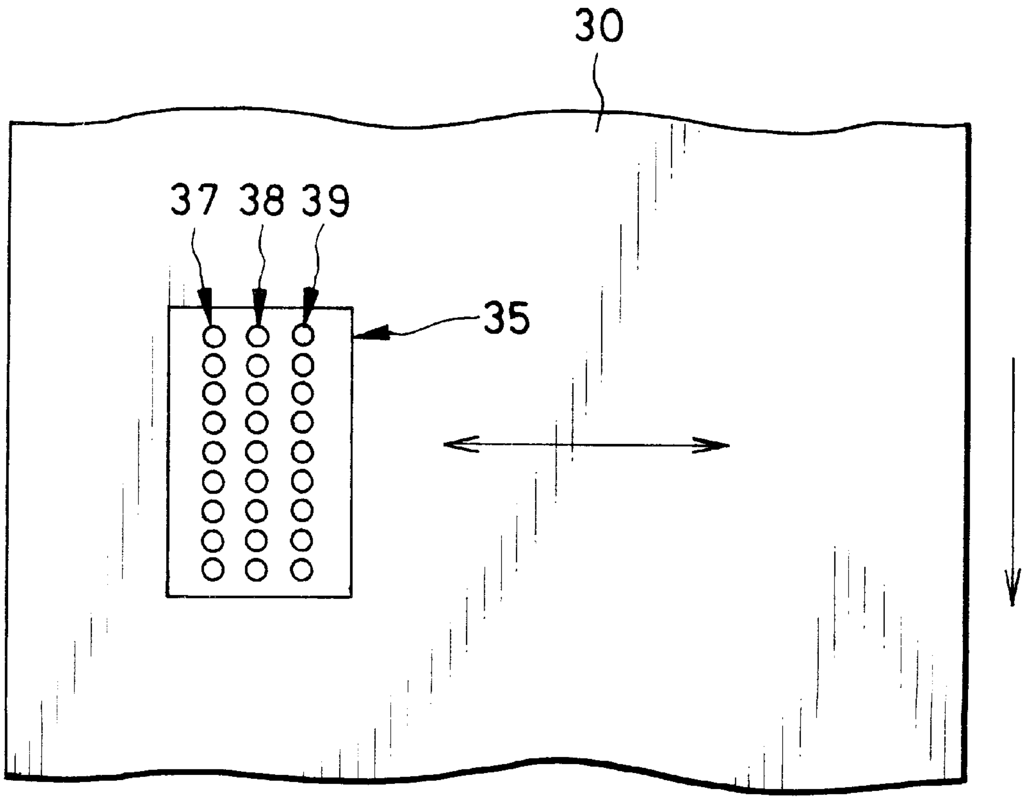
FIG. 5 is an explanatory view in plan, illustrating relative positions of the thermal transfer material and an ink jet recording head of a printer.

In FIG. 5, an ink jet recording head 35 includes nozzle arrays 37, 38 and 39 for yellow, magenta and cyan. The nozzle arrays 37–39 are arrays of nozzles arranged in the paper feeding direction, and are adjacent to each other in the width direction of the thermal transfer material 30. The ink jet recording head 35 is such a serial type that its entirety is movable in the width direction of the thermal transfer material 30. While the ink jet recording head 35 is moved forwards or backwards, one line of a frame image is recorded to the ink receiving transfer layer 31 in the thermal transfer material 30. The construction of the printer in addition to this is similar to that of the printer according to the above embodiment.

When image data of an image photographed by a digital camera is retrieved, the image data of the red, green and blue is converted to cyan, magenta yellow image data of an image that is a mirror image of the original image, and stored to an image memory. A desired one of frames is selected. The printing key is operated. The yellow image data is read from the image memory by one line, according to which the ink jet recording head 35 is driven. While the ink jet recording head 35 moves back and forth in the width direction of the thermal transfer material 30, the ink Jet recording head 35 jets yellow ink to the ink receiving transfer layer 31 in the thermal transfer material 30, to record one line of the yellow image to the ink receiving substance 32.

The thermal transfer material 30 is fed by a range of the one recorded line. Then yellow image data of one second line is read from the image memory. Yellow ink is jetted to the ink receiving transfer layer 31. Similarly, yellow ink is jetted to the ink receiving transfer layer 31 line after line. A yellow image of the one designated frame is recorded to the ink receiving substance 32 in the ink receiving transfer layer 31.

Then the thermal transfer material 30 is wound back to position a first line of the yellow image at the ink jet recording head 35. One line of magenta image data is read from the image memory. According to this, the ink jet recording head 35 is driven. Magenta ink is jetted by the ink jet recording head 35 to the ink receiving transfer layer 31 of the thermal transfer material 30. Similarly, a magenta image of the designated frame is recorded to the ink receiving transfer layer 31 in a manner overlapped on the yellow image. Furthermore, a cyan image of the designated frame is recorded to the ink receiving transfer layer 31 in a manner overlapped on the yellow and magenta images.

After the yellow, magenta and cyan images of the designated frame is recorded to the ink receiving transfer layer 31, the thermal transfer material 30 is fed to cause a frame recorded region in the thermal transfer material 30 to reach the position between the thermal head 24 and platen roller 25. The thermal head 24 is shifted toward the platen roller 25, and pressurizes and heats the thermal transfer material 30 in contact with the image receiving paper 18. In the thermal transfer material 30, the thermoplastic resin grains 33 are melted. The entirety of the ink receiving transfer layer 31 is peeled from the release layer 12 and transferred to the image receiving paper 18.

It is to be noted that, in addition to the above printer, the present invention is applicable to any type of printer having a recording head without applying heat, and in which ink or dye is provided for recording a mirror image of an original image, for example a plotter.

Figure 6:
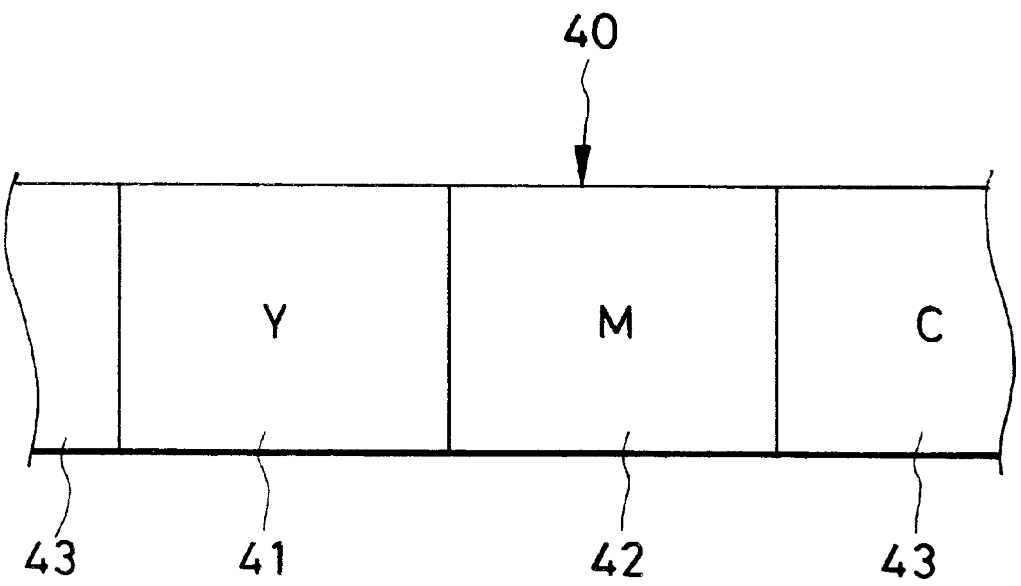
FIG. 6 is an explanatory view in plan, illustrating another preferred thermal transfer material with a pattern of regions of three colors.

In the first embodiment in FIG. 1, the micro capsules 17 for the three colors are mixed together in the coloring transfer layer 15. In contrast, FIG. 6 illustrates an embodiment in which thermal transfer material 40 includes first, second and third regions 41, 42 and 43. The thermal transfer material 40 is continuous sheet material. The three regions 41–43 are arranged cyclically in a lengthwise direction of the thermal transfer material 40 at a regular pitch. The first region 41 includes the micro capsules 17 for developing only the yellow color. The second region 42 includes the micro capsules 17 for developing only the magenta color. The third region 43 includes the micro capsules 17 for developing only the cyan color. Thus, yellow, magenta and cyan images are recorded to respectively the three regions 41–43. Each transfer layers of the three regions 41–43 are transferred to a common domain in the paper.

It is preferable that a pitch of the three regions 41–43 in the thermal transfer material 40 should be predetermined equal to a distance between the LED exposure head 23 and thermal head 24. This is effective in efficient printing, because the transfer of a first frame can be effected at the same time as image recording of a second frame. A size of each of the three regions 41–43 are the same as that of one frame, but can be larger than it.

In the above embodiment, the LED exposure head 23 is a line type. However, a serial type of the LED exposure head 23 may be used, which may include light-emitting diodes arranged in the sub scan direction and may move in the main scan direction back and forth. In the above embodiment, the heating elements in the thermal head 24 are arranged in the main scan direction. Alternatively, the thermal head 24 may be a type in which the heating elements are arranged in the sub scan direction, and which moves in the main scan direction back and forth.

Furthermore, a printer according to the present invention may include a platen plate to support the image receiving paper 18 straight, and may be constructed to feed the paper in a straight manner.

In the above embodiments, the coloring transfer layer 15 is exposed directly by the LED exposure head 23. However it is possible in the embodiments of FIGS. 1A and 6 for the LED exposure head 23 to expose the coloring transfer layer 15 through the heat resistant layer 11, support 13 and release layer 12. The LED exposure head 23 can be disposed on the side of the heat resistant layer 11. The heat resistant layer 11, support 13 and release layer 12 can be formed from transparent substances. This is advantageous in unnecessariness of exposing a mirror image that should be obtained by conversion.

Figure 7:
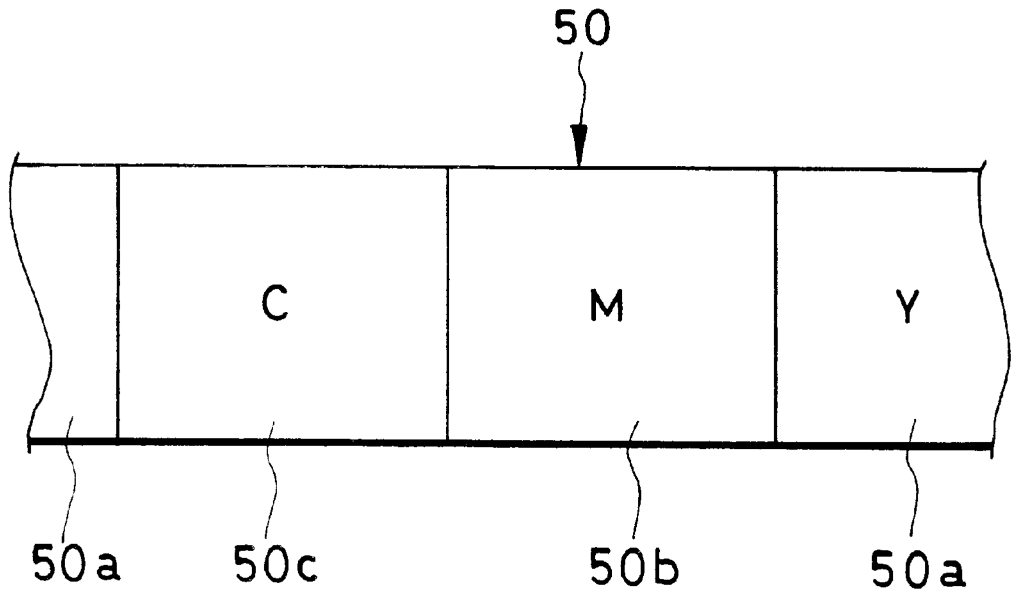
FIG. 7 is an explanatory view in plan, illustrating still another preferred thermal transfer material including thermosensitive coloring layers in cyclic regions.

Another preferred embodiment is described now, in which a transfer layer is transferred at the same time as an image is formed. In FIG. 7, thermal transfer material 50 has a continuous sheet shape. The thermal transfer material 50 has first, second and third regions 50*a*, 50*b* and 50*c* arranged cyclically in the lengthwise direction of the thermal transfer material 50. The three regions 50*a*–50*c* are adapted to thermal recording of different colors, yellow, magenta and cyan. The three regions 50*a*–50*c* are arranged in the entirety of the thermal transfer material 50 regularly in repetition.

Figures 8A, 8B, 8C:
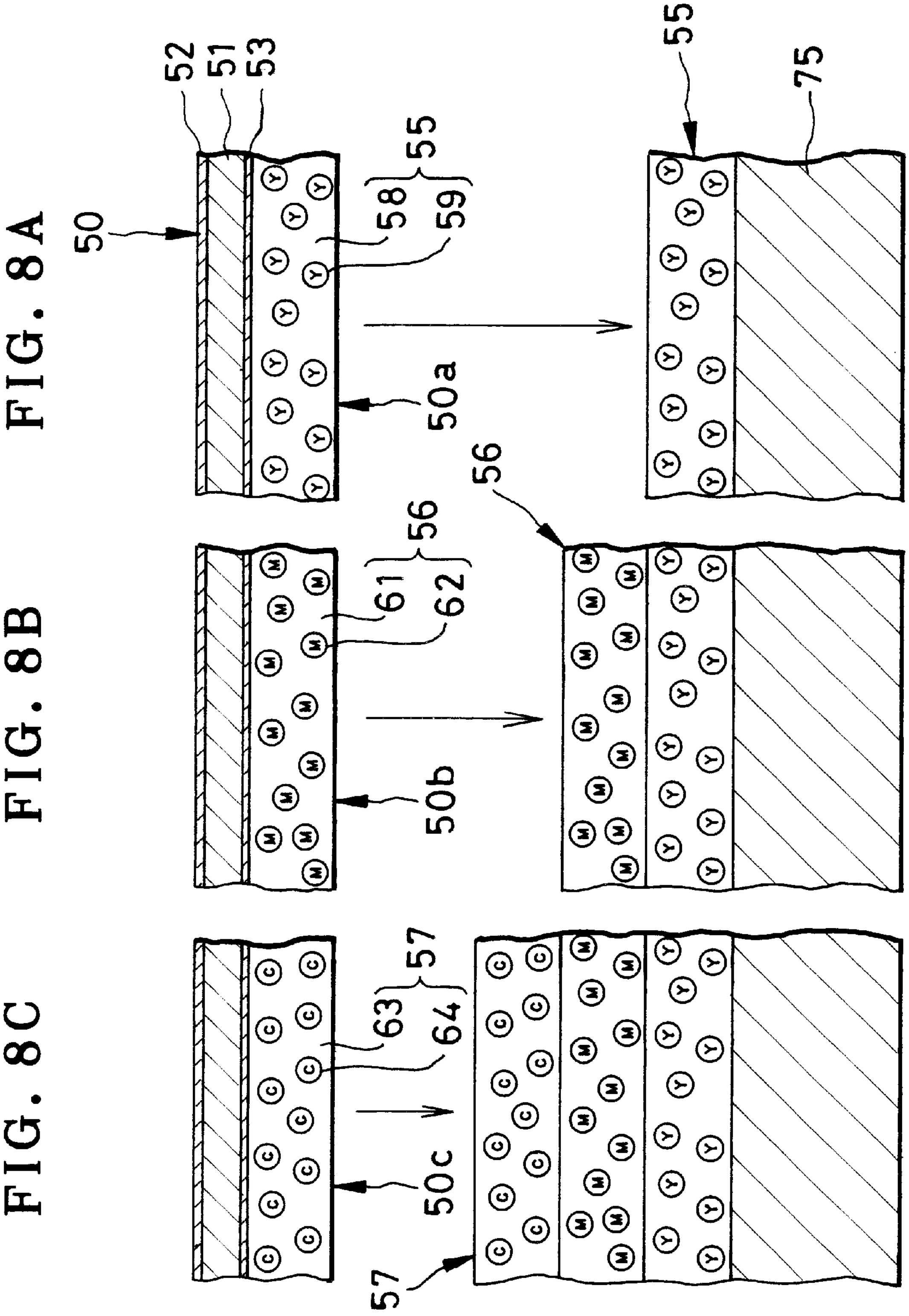
FIG. 8A is an explanatory view in section, illustrating yellow recording with the thermal transfer material and image receiving paper.
FIGS. 8B and 8C are explanatory views in section, illustrating magenta and cyan recording with the same as FIG. 8A.

In FIGS. 8A, 8B and 8C, the three regions 50*a*–50*c* are depicted as viewed in section. The thermal transfer material 50 includes a support 51, release layer 53 and heat resistant layer 52. In the first region 50*a*, a thermosensitive coloring transfer layer 55 for yellow is overlaid on the release layer 53. In the second region 50*b*, a thermosensitive coloring transfer layer 56 for magenta is overlaid on the release layer 53. In the third region 50*c*, a thermosensitive coloring transfer layer 57 for cyan is overlaid on the release layer 53.

The yellow coloring transfer layer 55 consists of coupler/thermoplastic resin 58 and micro capsules 59 distributed uniformly therein. The coupler/thermoplastic resin 58 as a first coloring substance is a mixture of yellow coloring coupler and thermoplastic resin. The micro capsules 59 include a diazonium salt compound as a second coloring substance of which the maximum absorption wavelength is 420 nm. When the yellow coloring transfer layer 55 is heated, the coupler in the coupler/thermoplastic resin 58 thermally reacts upon the diazonium salt compound in the micro capsules 59. So yellow color is developed. When the yellow coloring transfer layer 55 is heated to temperature high enough to develop color, the thermoplastic resin is softened and melted, because the present temperature is equal to or more than the glass transition temperature. To prevent the yellow coloring transfer layer 55 from further coloring in the course of magenta recording, the yellow coloring transfer layer 55 is fixed. When ultraviolet rays of 420 nm are applied to the yellow coloring transfer layer 55, the diazonium salt compound in the micro capsules 59 is photochemically decomposed to destroy the colorability.

The magenta coloring transfer layer 56 consists of coupler/thermoplastic resin 61 and micro capsules 62 a distributed uniformly therein. The coupler/thermoplastic resin 61 as a first coloring substance is a mixture of magenta coloring coupler and thermoplastic resin. The micro capsules 62 include a diazonium salt compound as a second coloring substance of which the maximum absorption wavelength is 365 nm. When the magenta coloring transfer layer 56 is heated, the coupler in the coupler/thermoplastic resin 61 thermally reacts upon the diazonium salt compound in the micro capsules 62. The thermoplastic resin is softened and melted. When ultraviolet rays of 365 nm are applied to the magenta coloring transfer layer 56, the diazonium salt compound in the micro capsules 62 is photochemically decomposed to destroy the colorability.

The cyan coloring transfer layer 57 consists of developer agent/thermoplastic resin 63 and micro capsules 64 distributed uniformly therein. The developer agent/thermoplastic resin 63 as a first coloring substance is a mixture of developer agent and thermoplastic resin. The micro capsules 64 include a leuco dye as a second coloring substance. When the cyan coloring transfer layer 57 is heated, the developer agent in the developer agent/thermoplastic resin 63 thermally reacts upon the leuco dye in the micro capsules 64 to develop the cyan color. The thermoplastic resin is softened and melted. The cyan coloring transfer layer 57 is not provided with optical fixability. Note that it is possible to provide the cyan coloring transfer layer 57 with optical fixability to electromagnetic rays.

To color the coloring transfer layers 55–57, coloring heat energy is applied to each of the coloring transfer layers 55–57. The coloring heat energy is a sum of bias heat energy and gradation heat energy, the bias heat energy being set for starting coloring at the minimum density, and the gradation heat energy being set to correspond to the density. In the present embodiment, the bias heat energy is predetermined equal between the coloring transfer layers 55–57. The thermoplastic resin in the coloring transfer layers 55–57 is melted by being heated to the glass transition point of the same.

The developer agent in the developer agent/thermoplastic resin 63 is mixed with the thermoplastic resin by means of binder at a proportion not influencing the color development. Examples of the binder are phenol compounds and aromatic carboxylic acid compounds, the phenol compounds including p-phenyl phenol, the aromatic carboxylic acid compounds including compounds of salicylic acid, gallic acid, and propyl tannic acid.

Examples of the thermoplastic resin are vinyl resin, acrylic resin, styrene resin, polyamide resin, wax, and the like. Examples of the vinyl resin are ethylene/vinyl acetate copolymer, rosin ester, vinyl alcohol/vinyl acetate copolymer, vinyl alkyl ether/maleic anhydride copolymer, polyvinyl chloride, and vinyl chloride/vinyl acetate copolymer. Examples of the acrylic resin are polyethyl acrylate, polybutyl methacrylate, and polymethyl cyanoacrylate.

The support 51 is plastic film with high thermal conductivity. Examples of plastic films for the support 51 are polyethylene terephthalate film, polyethylene naphthalate film and polyimide film. Also, it is possible not to overlay the release layer 53 on the support 51, and to form the support 51 from substance with good releasability. Examples of substances with comparatively good releasability are glassine paper, coated paper, polyester film, polyethylene film and polypropylene film.

Figure 9:
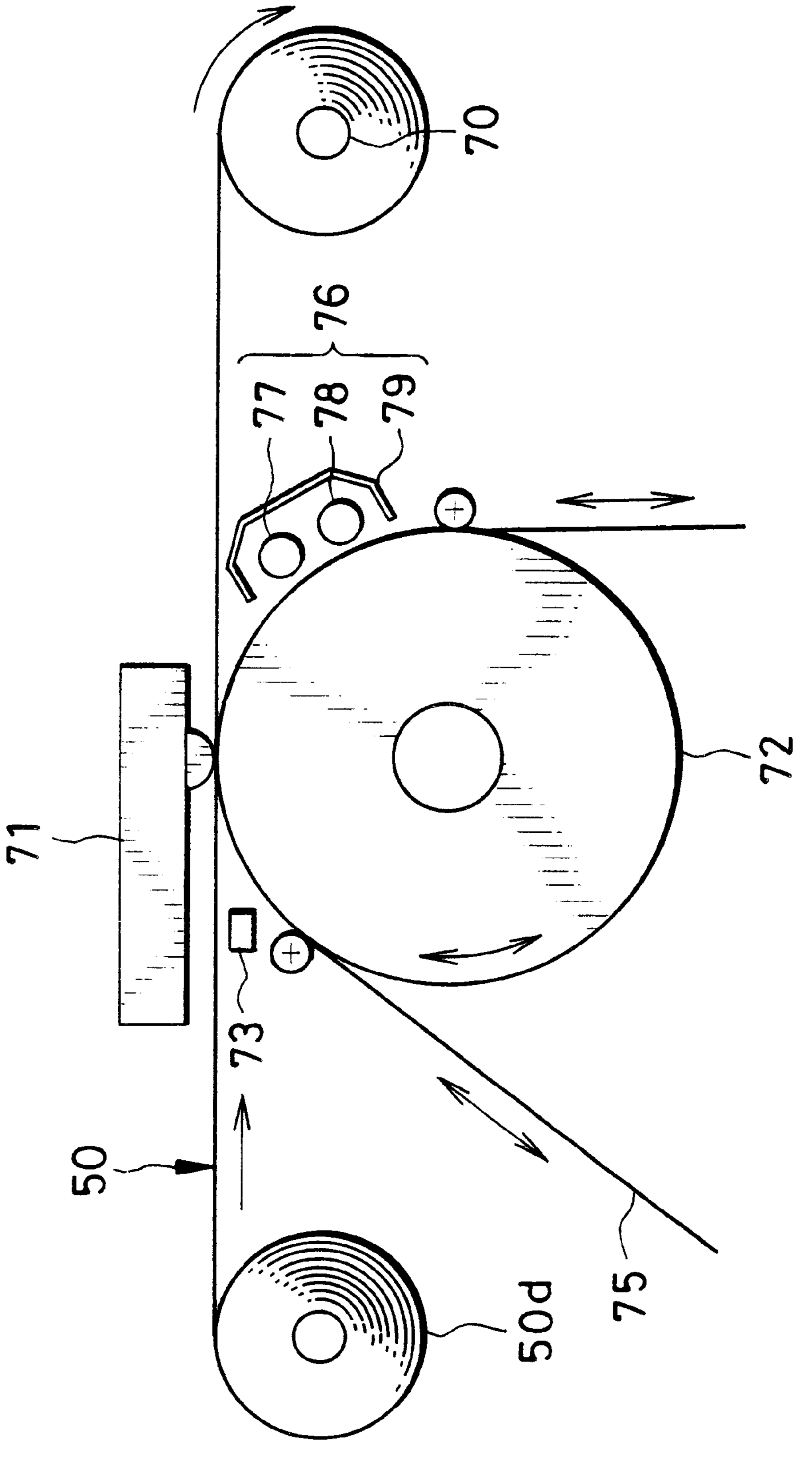
FIG. 9 is a side elevation illustrating a thermal printer.

In FIG. 9, the printer is supplied with a material roll 50*d*, in which the thermal transfer material 50 is wound with the coloring transfer layers 55–57 positioned internally. A feeder shaft 70 feeds the thermal transfer material 50 in a straight manner and winds the thermal transfer material 50 at the same time. Between the material roll 50*d* and feeder shaft 70, a thermal head 71 and platen roller 72 are disposed in a feed path of the thermal transfer material 50, and opposed to each other.

A region sensor 73 is disposed upstream from the thermal head 71 for detecting the three regions 50*a*–50*c* in the thermal transfer material 50. An optical fixer 76 is disposed downstream from the thermal head 71 and opposed to the periphery of the platen roller 72. The fixer 76 includes first and second rod-shaped fixer lamps 77 and 78 and a reflector 79. The fixer lamps 77 and 78 emit ultraviolet rays with the wavelengths peaking at approximately 420 and 365 nm.

The thermal head 71 is an array of a great number of heating elements arranged in the main scan direction, which is perpendicular to feeding of the thermal transfer material 50. The thermal head 71 is driven according to yellow, magenta and cyan image data of an image to be recorded. To record the yellow image, the region sensor 73 detects the first region 50a of the thermal transfer material 50 at first. Then the thermal transfer material 50 is fed at a predetermined length. When a front edge of the first region 50*a* reaches a position under the thermal head 71, then the thermal head 71 is shifted to push the support 51 of the thermal transfer material 50. At the same time, the thermal head 71 is driven according to the yellow image data.

The platen roller 72 rotates forwards or in a clockwise direction in FIG. 9 in synchronism with feeding of the thermal transfer material 50 while the thermal head 71 is driven. After the yellow and magenta recording, the platen roller 72 rotates backwards or in a counterclockwise direction in FIG. 9. Image receiving paper 75 is fed by the platen roller 72.

In operation, the printer is used to print an image photographed by a digital camera. At first, a memory card or smart media (trade name) storing image data is taken away from the digital camera, and is set in the printer. Frame designating keys in the printer are operated to select a desired frame. Then a printing key is operated. Gradation image data of the designated frame for the red, green and blue colors are converted to yellow, magenta and cyan image data, which are written to an image memory in a color separated manner. The image of the image data is a mirror image of the original image. Note that, alternatively, the image data of the original image may be used.

When the thermal transfer material 50 is fed straight, the region sensor 73 detects the first region 50*a*. The thermal transfer material 50 is fed further by a predetermined length. When a front edge of the first region 50*a* comes to a position under the thermal head 71, the thermal head 71 shifts to press the heat resistant layer 52 of the thermal transfer material 50. Yellow image data of one line is read from the image memory, sent to a head driver for the thermal head 71, which is driven.

Figure 10:
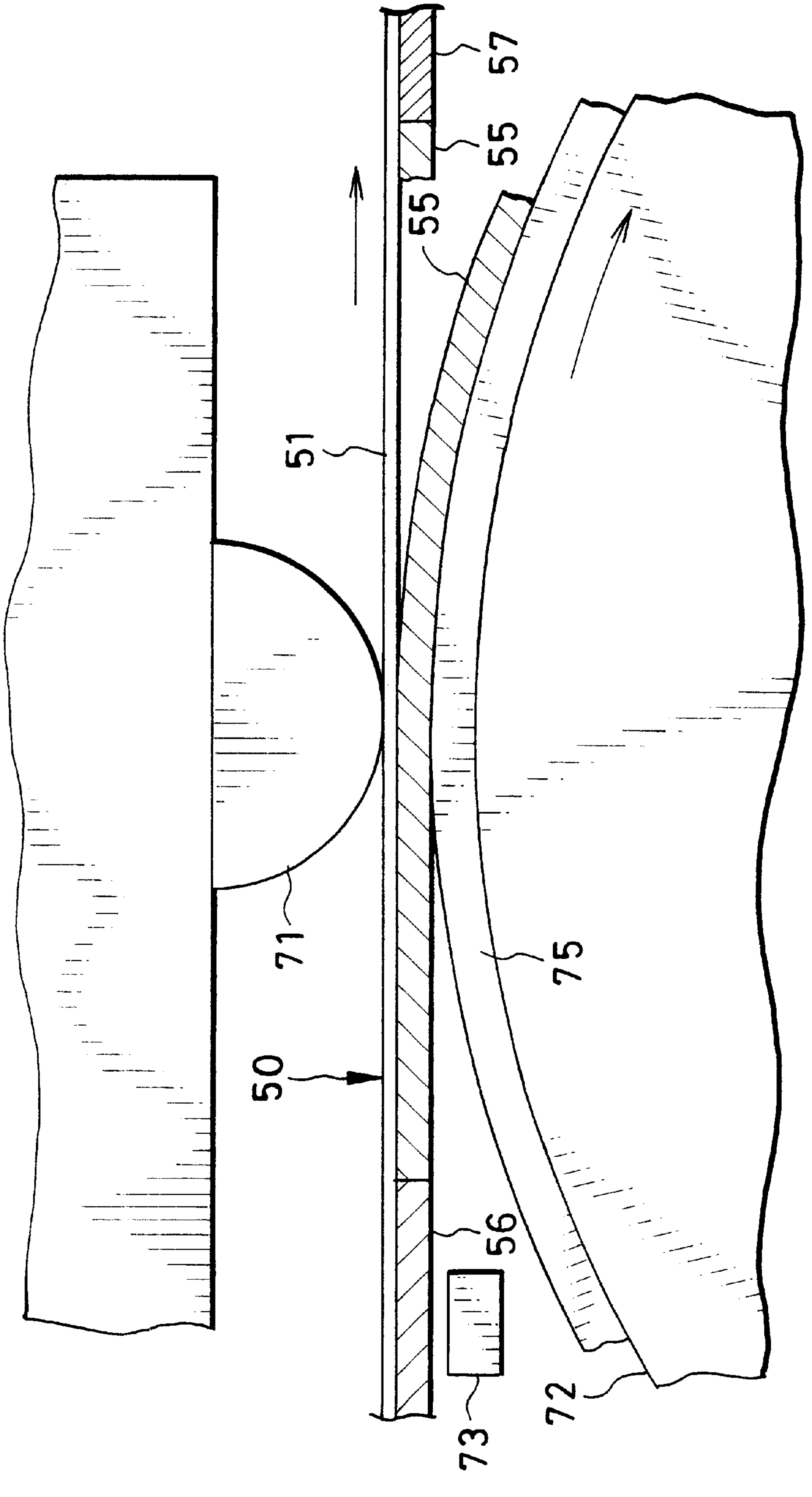
FIG. 10 is a side elevation in enlargement, illustrating a thermal head, a platen and the thermal transfer material.

The yellow coloring transfer layer 55 is heated through the heat resistant layer 52, support 51 and release layer 53. The coupler in the coupler/thermoplastic resin 58 reacts upon the diazonium salt compound in the micro capsules 59, to develop yellow color of a yellow image. At the same time, the thermoplastic resin in the coupler/thermoplastic resin 58 is heated to reach its glass transition point, and melted. In FIGS. 8A and 10, the yellow coloring transfer layer 55 is peeled at the release layer 53 and transferred to the image receiving paper 75. In synchronism with feeding of the thermal transfer material 50 by one line, the platen roller 72 rotates forwards to advance the image receiving paper 75 by one line.

Yellow image data of one second line is read from the image memory, to drive the thermal head 71. Yellow recording and layer transfer of the yellow coloring transfer layer 55 are effected simultaneously. Similarly, the yellow coloring transfer layer 55 is subjected to image recording and transfer line after line, until one frame of the yellow image is recorded. Then the thermal head 71 is shifted away from the thermal transfer material 50.

When the yellow coloring transfer layer 55 transferred to the image receiving paper 75 reaches a position of the fixer 76 by rotation of the platen roller 72, near ultraviolet rays peaking at approximately 420 nm are applied to the yellow coloring transfer layer 55 by the first fixer lamp 77. The diazonium salt compound in the micro capsules 59 is photochemically decomposed to lose the coloring ability. The yellow coloring transfer layer 55 is fixed.

When all the yellow coloring transfer layer 55 transferred to the image receiving paper 75 is optically fixed, the platen roller 72 is caused to rotate backwards to return the image receiving paper 75. When the image receiving paper 75 comes back to a printing starting position, then the platen roller 72 is changed over, and rotates forwards. A front edge of the second region 50*b* is now under the thermal head 71. The thermal head 71 shifts to press the thermal transfer material 50. Magenta image data of one line is read from the image memory, to drive the thermal head 71 according thereto.

The thermal head 71 applies heat to the magenta coloring transfer layer 56. The coupler in the coupler/thermoplastic resin 61 is caused to react thermally upon the diazonium salt compound in the micro capsules 62, to develop magenta color. At the same time, the thermoplastic resin in the coupler/thermoplastic resin 61 is melted. In FIG. 8B, the magenta coloring transfer layer 56 is peeled at the release layer 53, and transferred to the image receiving paper 75 to overlap on the yellow coloring transfer layer 55.

Although the yellow coloring transfer layer 55 is heated as well, the yellow coloring transfer layer 55 does not develop color any further, because fixed. Similarly, the magenta coloring transfer layer 56 is subjected to the image recording and transfer line after line. When the magenta coloring transfer layer 56 with a magenta image of one frame is transferred to overlap on the yellow coloring transfer layer 55, then the thermal head 71 shifts away from the thermal transfer material 50.

The platen roller 72 rotates further in the forward direction. When the magenta coloring transfer layer 56 positioned with the yellow coloring transfer layer 55 reaches to the station under the fixer 76, then ultraviolet rays peaking at approximately 365 nm are applied to the magenta coloring transfer layer 56 by the second fixer lamp 78. The diazonium salt compound in the micro capsules 62 is photochemically decomposed to destroy the coloring ability. The magenta coloring transfer layer 56 is fixed.

Then the platen roller 72 rotates backwards to return the image receiving paper 75. At the end of the magenta recording, the front end of the third region 50c in the thermal transfer material 50 is located under the thermal head 71. The platen roller 72 is changed over and rotates forwards. The thermal head 71 is shifted to press the thermal transfer material 50.

Cyan image data of a first line is read from the image memory, to drive the thermal head 71 according thereto. In the cyan coloring transfer layer 57, the leuco dye in the micro capsules 64 reacts upon the developer agent in the developer agent/thermoplastic resin 63, to develop the cyan color of a cyan image. At the same time, the thermoplastic resin in the developer agent/thermoplastic resin 63 is melted. In FIG. 8C, the cyan coloring transfer layer 57 is peeled and transferred to the image receiving paper 75 to overlap on the magenta coloring transfer layer 56.

Similarly, the cyan coloring transfer layer 57 is subjected to the image recording and transfer line after line. When the cyan coloring transfer layer 57 with a cyan image of one frame is transferred to overlap on the magenta coloring transfer layer 56, then the thermal head 71 stops being driven, and shifts away from the thermal transfer material 50. There is no application of ultraviolet rays to the cyan coloring transfer layer 57. The platen roller 72 is rotated forwards continuously, to eject the image receiving paper 75 from the printer with the coloring transfer layers 55–57 transferred thereto.

In the present embodiment, the image recording and transfer are effected at the same time, because melting heat energy for melting the coloring transfer layers 55–57 is predetermined equal to the bias heat energy of the coloring transfer layers 55–57. Alternatively, it is possible to effect the transfer after the image recording. To this end, the melting heat energy can be predetermined sufficiently higher than the coloring heat energy of the coloring transfer layers 55–57 that is the sum of the bias heat energy and gradation heat energy. In operation, the coloring transfer layers 55–57 are subjected to image recording successively, before the coloring transfer layers 55–57 are transferred sequentially to the image receiving paper 75 by positioning the three regions 50*a*–50*c* on the image receiving paper 75.

Figure 11:
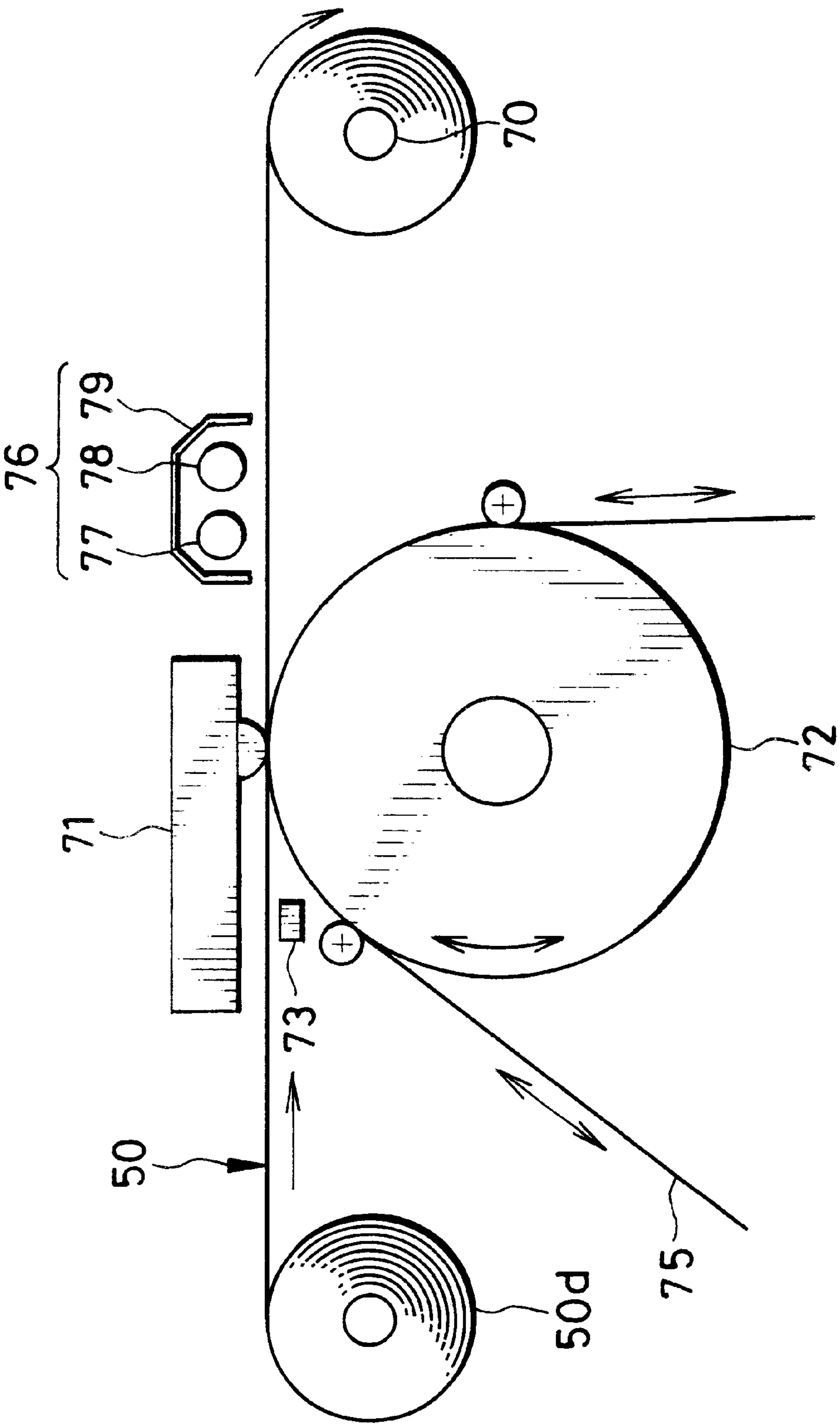
FIG. 11 is a side elevation illustrating another preferred thermal printer.

Although the transfer of the cyan coloring transfer layer 57 is at the same time as the coloring, it is possible that the transfer of the coloring transfer layers 55 and 56 is later than the coloring. A printer for the thermal transfer material 50 with this construction is illustrated in FIG. 11. In the thermal transfer material 50, melting heat energy for yellow is predetermined higher than bias heat energy for yellow. Melting heat energy for magenta is predetermined higher than bias heat energy for magenta. Melting heat energy for cyan is equal to bias heat energy for cyan. In FIG. 11, the fixer 76 in the printer has a different position than that according to the above embodiment. In operation, the yellow coloring transfer layer 55 is subjected to image recording and fixed at first. Then the magenta coloring transfer layer 56 is subjected to image recording and fixed. The cyan coloring transfer layer 57 is subjected to image recording, and transferred to the image receiving paper 75 at the same time. The magenta coloring transfer layer 56 is transferred to the image receiving paper 75 to overlap on the cyan coloring transfer layer 57 next. Finally, the yellow coloring transfer layer 55 is transferred to the image receiving paper 75 to overlap on the magenta coloring transfer layer 56. Therefore, the yellow, magenta and cyan can be developed without color mixture.

It is to be noted that the thermal printer of FIG. 11 is used with the thermal transfer material 50 but in which the support 51, heat resistant layer 52 and release layer 53 are transparent. This is for the purpose of transmittance of electromagnetic rays for the fixation of the coloring transfer layers 55 and 56.

Note that, in the printer of FIG. 11, the image recording and transfer of the cyan coloring transfer layer 57 may be at the same time as, or prior to, the fixation of the yellow or magenta coloring transfer layer 55 or 56. Also, the image recording and transfer of the cyan coloring transfer layer 57 may be the earliest or latest step included in the process of the full-color recording of the thermal transfer material 50.

Figure 12:
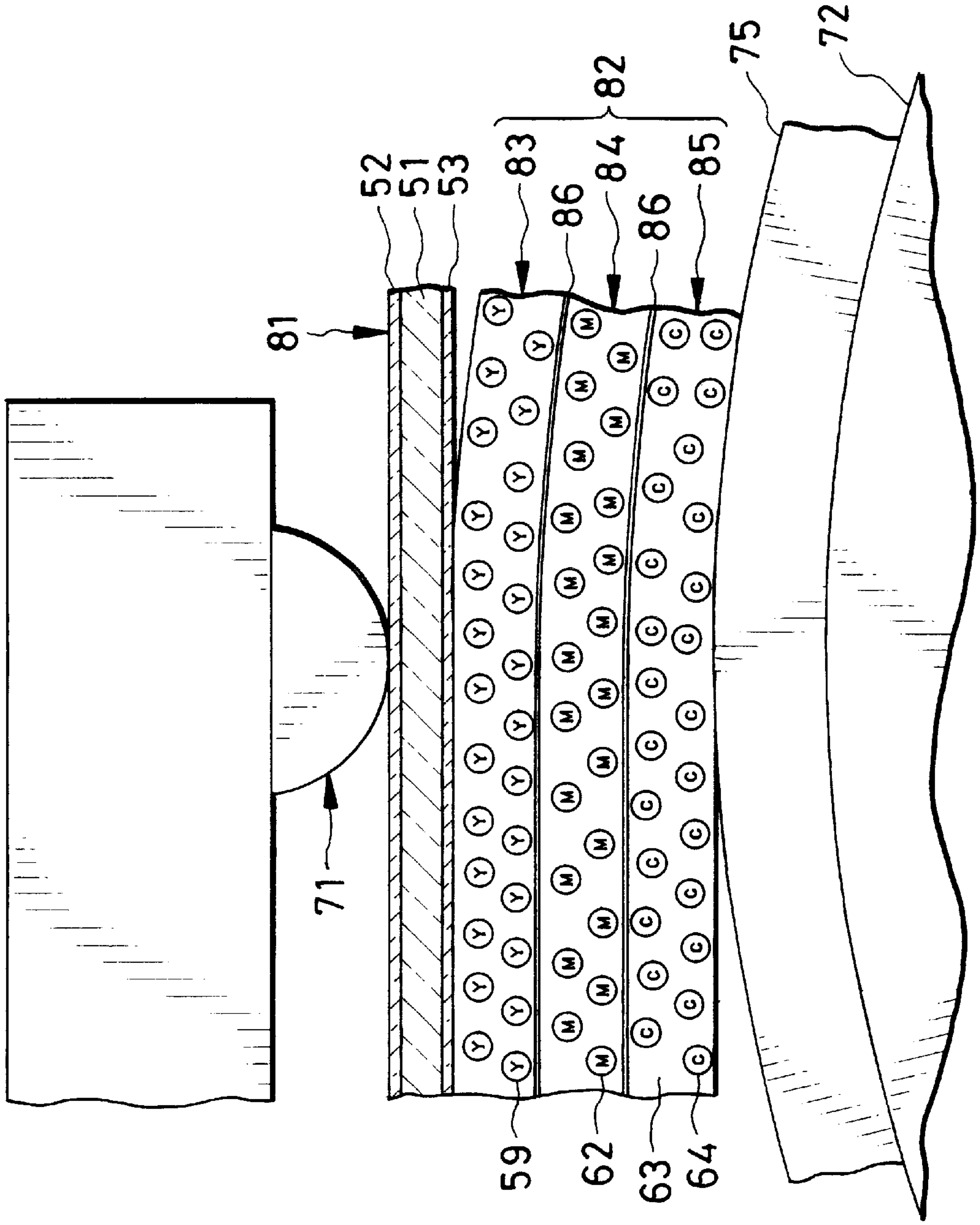
FIG. 12 is a side elevation in enlargement, illustrating a thermal head, a platen and the thermal transfer material in still another preferred thermal printer.

Another preferred embodiment is described now, in which thermal transfer material 81 of FIG. 12 is used. The thermal transfer material 81 includes a transfer layer group 82 overlaid on the release layer 53. The transfer layer group 82 is a layer group including thermosensitive coloring layers 83, 84 and 85 for yellow, magenta and cyan in the order from the release layer 53. There are intermediate layers 86 positioned between the coloring layers 83 and 84 and between the coloring layers 84 and 85, to adjust heat sensitivity of the coloring layers 83–85. In the present embodiment, the yellow coloring layer 83 is subjected to the image recording at first among the three. The coloring layers 83 and 84 are subjected to optical fixation through the support 51, as the fixer 76 is disposed in the position illustrated in FIG. 11. Thus, the support 51, heat resistant layer 52 and release layer 53 are transparent, and transmit ultraviolet rays. In the cyan coloring layer 85, thermoplastic resin is included for the purpose of connection with the image receiving paper 75 by transfer.

Figure 13:
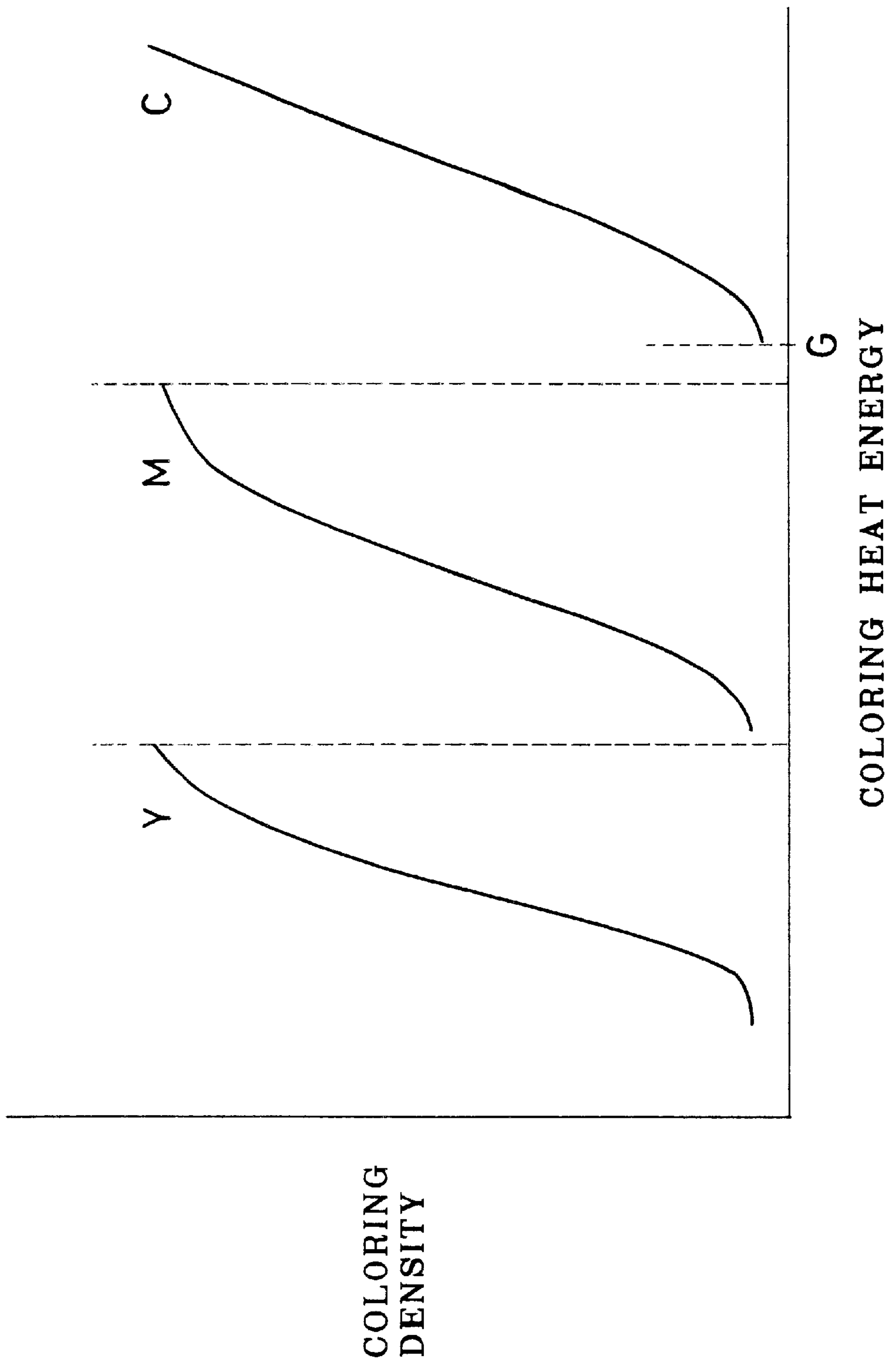
FIG. 13 is a graph illustrating the coloring characteristic of the thermal transfer material.

The coloring layers 83–85 are different in coloring heat energy. See FIG. 13. Among those, the coloring heat energy of the yellow coloring layer 83 is predetermined the lowest. That of the cyan coloring layer 85 is predetermined the highest. There is no overlapping between three ranges of the coloring heat energy for the coloring layers 83–85. For the cyan coloring layer 85 to be colored finally, melting heat energy G is predetermined equal to bias heat energy for cyan, the melting heat energy G being such as to heat the cyan coloring layer 85 up to the glass transition point of the thermoplastic resin therein. Therefore, the thermoplastic resin is melted upon the image recording of the cyan coloring layer 85 and stuck to the image receiving paper 75. The entirety of the transfer layer group 82 is peeled from the release layer 53 and transferred to the image receiving paper 75.

Note that the release layer 53 may have such a glass transition point that the temperature of the release layer 53 reaches it at the time of color development of the cyan coloring layer 85. Thus, the release layer 53 can be melted upon melting the cyan coloring layer 85, to make the transfer layer group 82 transferred more easily and readily.

Furthermore, a printer for use with the thermal transfer material 81 may be a three head type, in which three thermal heads and three platen rollers are included. The first thermal head and first platen roller may operate for image recording to the yellow coloring layer 83. The second thermal head and second platen roller may operate for image recording to the magenta coloring layer 84. The third platen roller can support the image receiving paper 75, and cooperate with the third thermal head for the image recording and transfer of the cyan coloring layer 85.

In any of the above embodiments, the image receiving material is the image receiving paper 18, 75. However, any film, sheet or plate may be used as image receiving material, for example fabric for a T-shirt. Furthermore, printing according to the present invention may be monochromatic. Thermal transfer material may have only one coloring transfer layer overlaid on a support.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. Thermal transfer material comprising:

a support;

a release layer overlaid on said support; and a coloring transfer layer overlaid on said release layer in a peelable manner, having thermoplasticity for thermal adhesion, adapted to forming an image therein, and colorable by being exposed and then pressurized, said coloring transfer layer including:

a thermoplastic resin, softened or melted when said transfer layer is heated through said support, for adhesion of said transfer layer to said image receiving material;

developer agent; and plural micro capsules distributed uniformly, said micro capsules including dye precursor, photo-setting resin and photo polymerization initiator, wherein said photo-setting resin and said photo polymerization initiator harden said micro capsules upon application of light, said dye precursor flows by pressurization out of unhardened remainder of said micro capsules and reacts upon said developer agent to develop a predetermined color comprising at least three primary colors, said micro capsules comprise first, second and third types associated respectively with said three primary colors, and said micro capsules of said types are hardened by light respectively of colors complimentary to said primary colors, and wherein said coloring transfer layer is constituted by first, second and third regions arranged cyclically in a longitudinal direction of said support, and said regions include respectively one of said first, second and third types of said micro capsules.

2. Thermal transfer material comprising:

a support;

a release layer overlaid on said support; and a coloring transfer layer overlaid on said release layer in a peelable manner, having thermoplasticity for thermal adhesion, adapted to forming an image therein, and including a thermoplastic resin, softened or melted when said transfer layer is heated through said support, for adhesion of said transfer layer to said image receiving material, said coloring transfer layer being colorable in a predetermined color by application of heat, wherein said support has a continuous shape, said transfer layer comprises at least three thermosensitive coloring layers for developing colors different therebetween, and said thermosensitive coloring layers are arranged in sequence in a longitudinal direction of said support in a peelable manner.

3. A thermal transfer material as defined in claim 2, wherein said thermosensitive coloring layers have an equal length in said support longitudinal direction.

4. A printing method in which a thermal transfer material is used;

wherein said thermal transfer material comprises a support, a release layer overlaid on said support, and a thermosensitive coloring transfer layer, overlaid on said release layer, colorable in a predetermined color in response to application of heat, and having thermoplasticity;

said printing method comprising the steps of:

placing said thermosensitive coloring transfer layer on an image receiving material; and heating and pressurizing said thermal transfer material while said thermosensitive coloring transfer layer is placed on said image receiving material, so as to record an image thermally in said thermosensitive coloring transfer layer and transfer said thermosensitive coloring transfer layer to an image receiving material at substantially the same time.

5. A printing method as defined in claim 4, wherein said support has a continuous shape, said thermosensitive coloring transfer layer comprises first, second and third thermosensitive coloring transfer layers, overlaid on said release layer, arranged cyclically at a regular pitch, for developing one of three colors different therebetween, said first and second thermosensitive coloring transfer layers having optical fixability in response to electromagnetic rays in a predetermined wavelength range.

6. A printing method as defined in claim 5, wherein said transferring step comprises first, second and third transferring steps for transferring said first, second and third thermosensitive coloring transfer layers to said image receiving material in sequence to overlie on one another; further comprising steps of:

photochemically fixing said first thermosensitive coloring transfer layer being transferred between said first and second transferring steps; and photochemically fixing said second thermosensitive coloring transfer layer being transferred between said second and third transferring steps.

7. A printing method in which thermal transfer material is used;

wherein said thermal transfer material comprises a support, a release layer overlaid on said support, and first, second and third thermosensitive coloring transfer layers, overlaid on said release layer, arranged cyclically at a regular pitch, for developing one of three colors different therebetween, said first and second thermosensitive coloring transfer layers having optical fixability in response to electromagnetic rays in a predetermined wavelength range, said first, second and third thermosensitive coloring transfer layers having thermoplasticity;

said printing method comprising steps of:

heating and pressurizing said first and second thermosensitive coloring transfer layers for image recording thereto;

photochemically fixing said first and second thermosensitive coloring transfer layers after said image recording;

heating and pressurizing said third thermosensitive coloring transfer layer for image recording thereto and for transferring said third thermosensitive coloring transfer layer to image receiving material; and heating and pressurizing said first and second thermosensitive coloring transfer layers for transferring said first and second thermosensitive coloring transfer layers to said image receiving material after fixation, to overlie on said third thermosensitive coloring transfer layer.

8. A printing method in which a thermal transfer material is used;

wherein said thermal transfer material comprises a support, a release layer overlaid on said support, and first, second and third thermosensitive coloring transfer layers, overlaid on one another in sequence from said release layer, for developing one of three colors, said first thermosensitive coloring transfer layer is disposed closest to said support, said second thermosensitive coloring transfer layer is disposed next closest to said support, said first and second thermosensitive coloring transfer layers having optical fixability in response to electromagnetic rays in a predetermined wavelength range, said third thermosensitive coloring transfer layer is disposed farthest from said support, and includes thermoplastic resin, and said thermoplastic resin is heated to a glass transition point thereof upon image recording of said third thermosensitive coloring transfer layer;

said printing method comprising the steps of:

heating and pressurizing said first thermosensitive coloring transfer layer for image recording thereto;

photochemically fixing said first thermosensitive coloring transfer layer after said image recording;

heating and pressurizing said second thermosensitive coloring transfer layer for image recording thereto after said first thermosensitive coloring transfer layer is fixed;

photochemically fixing said second thermosensitive coloring transfer layer after said image recording; and after said second thermosensitive coloring transfer layer is fixed, heating and pressurizing said third thermosensitive coloring transfer layer for image recording thereto and for transferring said first, second and third thermosensitive coloring transfer layers to an image receiving material at substantially the same time.

9. A printing method comprising the steps of:

feeding a thermal transfer material through a printing apparatus, said thermal transfer material comprising a support, a release layer overlaid on said support, and a coloring transfer layer, overlaid on said release layer, having thermoplasticity, and colorable by being exposed and pressurized;

forming a latent image in said coloring transfer layer by exposing said coloring transfer layer;

placing said coloring transfer layer on an image receiving material after said latent image is formed; and heating and pressurizing said thermal transfer material while said coloring transfer layer is placed on said image receiving material making said latent image visible and transferring said coloring transfer layer to said image receiving material, wherein said thermal transfer material passes through said printing apparatus in a continuous manner during said step of feeding, and said steps of forming a latent image and heating and pressurizing are performed during said step of feeding.

* * * * *